(12) United States Patent
Fujii et al.

(10) Patent No.: US 9,920,427 B2
(45) Date of Patent: Mar. 20, 2018

(54) SEMICONDUCTOR MANUFACTURING APPARATUS AND MANUFACTURING METHOD OF SEMICONDUCTOR DEVICE

(71) Applicant: Toshiba Memory Corporation, Minato-ku (JP)

(72) Inventors: Motoki Fujii, Yokkaichi (JP); Fumiki Aiso, Kuwana (JP); Hajime Nagano, Yokkaichi (JP); Ryota Fujitsuka, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/751,378

(22) Filed: Jun. 26, 2015

(65) Prior Publication Data

US 2016/0222514 A1    Aug. 4, 2016

Related U.S. Application Data

(60) Provisional application No. 62/110,831, filed on Feb. 2, 2015.

(51) Int. Cl.
| | | |
|---|---|---|
| C23C 16/00 | (2006.01) | |
| C23C 16/458 | (2006.01) | |
| H01L 21/02 | (2006.01) | |
| C23C 16/40 | (2006.01) | |
| C23C 16/455 | (2006.01) | |

(52) U.S. Cl.
CPC ........ *C23C 16/4584* (2013.01); *C23C 16/402* (2013.01); *C23C 16/45551* (2013.01); *H01L 21/0228* (2013.01); *H01L 21/02164* (2013.01)

(58) Field of Classification Search
CPC . C23C 16/52; C23C 16/402; C23C 16/45551; H01L 21/02164; H01L 21/0228
See application file for complete search history.

(56) References Cited

U.S. PATENT DOCUMENTS

| | | | | |
|---|---|---|---|---|
| 5,693,579 | A | * 12/1997 | Ishikawa | ............... C23C 16/402 |
| | | | | 257/E21.279 |
| 2010/0055316 | A1 | 3/2010 | Honma | |
| 2013/0074770 | A1* | 3/2013 | Honma | ................. C23C 16/401 |
| | | | | 118/719 |

FOREIGN PATENT DOCUMENTS

| | | |
|---|---|---|
| JP | 5107185 | 12/2012 |
| JP | 2013-069909 | 4/2013 |

* cited by examiner

*Primary Examiner* — Richard Booth
(74) *Attorney, Agent, or Firm* — Oblon, McClelland, Maier & Neustadt, L.L.P.

(57) ABSTRACT

A semiconductor manufacturing apparatus according to an embodiment comprises a reaction chamber in which a semiconductor substrate is capable of being accommodated when a deposited film is to be formed on a surface of the semiconductor substrate. A first supplier supplies a source gas to a first area in the reaction chamber. A second supplier supplies an oxidation gas to a second area in the reaction chamber. A third supplier supplies a hydrogen gas to a third area between the first area and the second area in the reaction chamber. A stage moves the semiconductor substrate to any one of the first to third areas.

2 Claims, 4 Drawing Sheets

SEMICONDUCTOR MANUFACTURING APPARATUS AND MANUFACTURING METHOD OF SEMICONDUCTOR DEVICE

CROSS REFERENCE TO RELATED APPLICATIONS

This application is based upon and claims the benefit of priority from the prior U.S. Provisional Patent Application No. 62/110,831, filed on Feb. 2, 2015, the entire contents of which are incorporated herein by reference.

FIELD

The embodiments of the present invention relate to a semiconductor manufacturing apparatus and a manufacturing method of semiconductor device.

BACKGROUND

Contacts used in a three-dimensionally stacked memory or the like are formed deeply to electrically connect a lower layer wiring and an upper layer wiring with each other via a stacked structure of word lines in some cases. Because an aspect ratio of contact holes becomes high in these cases, it becomes difficult to form a silicon dioxide film on side surfaces of the contact holes. For example, when $O_2$ plasma oxidation is applied to an ALD (Atomic Layer Deposition) method, oxygen radicals are easily deactivated and thus it is difficult to form an oxide film having a uniform film thickness to reach deep portions of the contact holes. When plasma oxidation having enhanced oxidation power, such as ozone oxidation, is applied to the ALD method, a material of the word lines (tungsten, for example) as well as a film forming source (a precursor) is also oxidized, which leads to short-circuit between the word lines and the contacts.

Furthermore, in the ALD method, after the film forming source is caused to adhere to a semiconductor substrate and the film forming source is selectively oxidized, nitrogen ($N_2$) purge is performed. In an atmosphere at a high temperature (a temperature equal to or higher than 700° C., for example) in which the film forming source is oxidized, the material of the word lines is also oxidized even during the $N_2$ purge if oxygen remains in a reaction chamber. The material of the word lines sublimates during the $N_2$ purge, which may cause whiskers. Furthermore, there are cases where a partial pressure ratio ($O_2/H_2$) of $H_2O/H_2$ changes due to a gas from the semiconductor substrates when many semiconductor substrates are to be processed in a batch reaction chamber. If the partial pressure ratio of $H_2O/H_2$ changes, an oxidation rate ratio between the film forming source and the material of the word lines changes. Also in this case, there is a risk of oxidation of the material of the word lines.

DETAILED DESCRIPTION

Embodiments will now be explained with reference to the accompanying drawings. The present invention is not limited to the embodiments.

A semiconductor manufacturing apparatus according to an embodiment comprises a reaction chamber in which a semiconductor substrate is capable of being accommodated when a deposited film is to be formed on a surface of the semiconductor substrate. A first supplier supplies a source gas to a first area in the reaction chamber. A second supplier supplies an oxidation gas to a second area in the reaction chamber. A third supplier supplies a hydrogen gas to a third area between the first area and the second area in the reaction chamber. A stage moves the semiconductor substrate to any one of the first to third areas.

Figure 1A:
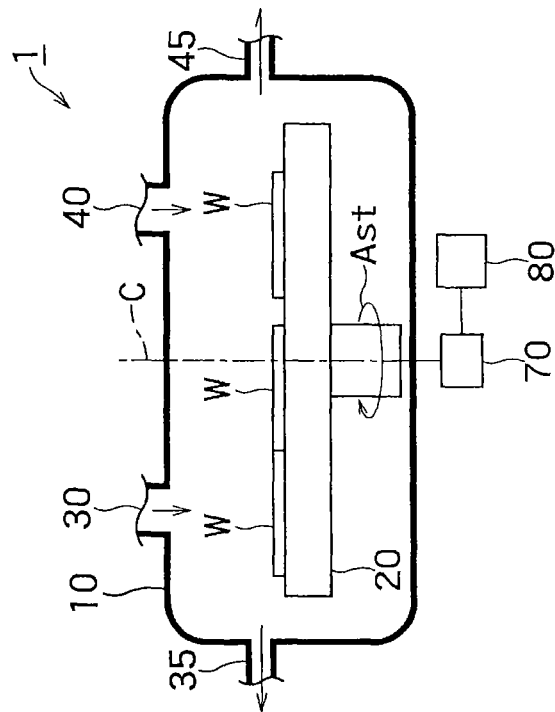
FIGS. 1A and 1B are a schematic plan view and a schematic cross-sectional view, respectively, showing an example of a configuration of an ALD film forming apparatus 1 according to an embodiment.
Figure 1B:
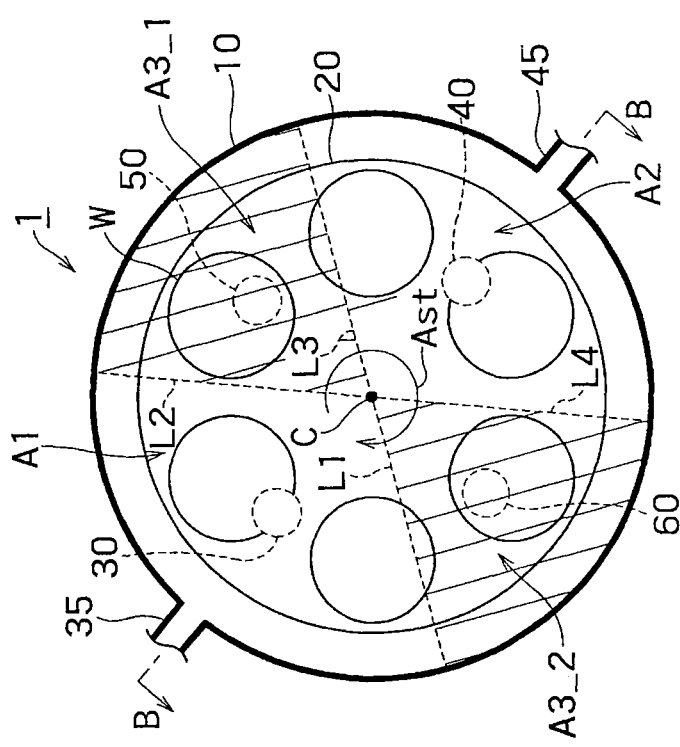

FIGS. 1A and 1B are a schematic plan view and a schematic cross-sectional view, respectively, showing an example of a configuration of an ALD film forming apparatus (hereinafter, "film forming apparatus") 1 according to an embodiment. The film forming apparatus 1 includes a reaction chamber 10, a stage 20, a source gas supplier 30, an oxidation gas supplier 40, hydrogen gas suppliers 50 and 60, gas discharging parts 35 and 45, a driver 70, and a controller 80.

The reaction chamber 10 is used to accommodate therein a semiconductor substrate W and to form a deposited film (an oxide film) on a surface of the semiconductor substrate W by the ALD method. By the ALD method, a source gas (a precursor) is supplied into the reaction chamber 10 that is evacuated to produce a vacuum and a source film is formed on the surface of the semiconductor substrate W. The source film is oxidized, thereby forming a deposited film (an oxide film) at an atomic layer level on the semiconductor substrate W. By repeating this forming cycle of a deposited film at an atomic layer level, a deposited film of a desired thickness can be formed on a semiconductor wafer.

The stage 20 has a single or a plurality of semiconductor substrates W mounted thereon in the reaction chamber 10 (plural substrate processing). The stage 20 is, for example, circular as shown in FIG. 1A and can rotate around a center C of the stage 20 as an axis (rotate on its own axis) as shown by an arrow Ast. With rotation of the stage 20 on its own axis, the semiconductor substrate W can be rotationally moved around the center C in a direction shown by the arrow Ast together with the stage 20 in the reaction chamber 10.

The source gas supplier 30 serving as a first supplier supplies a source gas to a first area A1 in the reaction chamber 10. The first area A1 is a fan-shape spatial region between a broken line L1 and a broken line L2 in the space of the reaction chamber 10 shown in FIG. 1A. The source gas is a gas serving as a source of a deposited film. For example, the source gas is an aminosilane-based gas such as $SiH_2(N(CH_2CH_3)_2)_2$ (BDEAS) or $C_6H_{19}N_3Si$ (TrisDMAS), $SiH_2Cl_2$, $Si_2Cl_6$, $SiCl_4$, $AlCl_3$, $HfCl_4$, or $ZrCl_3$. When $SiCl_4$ is used as the source gas, $SiCl_4$ adheres to the surface of the semiconductor substrate W and a silicon dioxide film ($SiO_2$) being an oxide film of $SiCl_4$ is formed as the deposited film. When $AlCl_3$ is used as the source gas, $AlCl_3$ adheres to the surface of the semiconductor substrate W and $Al_2O_3$ (alumina) being an oxide film of $AlCl_3$ is formed as the deposited film. When $HfCl_4$ is used as the source gas, $HfCl_4$ adheres to the surface of the semiconductor substrate W and HfO$_2$ (hafnia) being an oxide film of HfCl$_4$ is formed as the deposited film. When ZrCl$_3$ is used as the source gas, ZrCl$_3$ adheres to the surface of the semiconductor substrate W and Zr$_2$O$_3$ (zirconia) being an oxide film of ZrCl$_3$ is formed as the deposited film. The following explanations are given assuming that a silicon dioxide film is deposited.

The oxidation gas supplier 40 serving as a second supplier supplies an oxidation gas to a second area A2 in the reaction chamber 10. The oxidation gas supplier 40 is provided on the opposite side of the center C of the stage 20 to the source gas supplier 30. The second area A2 is a fan-shape spatial region between a broken line L3 and a broken line L4 in the space of the reaction chamber 10 shown in FIG. 1A. The second are A2 is located on the opposite side of the center C of the stage 20 to the first area A1. The oxidation gas is a gas that oxidizes the source having adhered to the semiconductor substrate W. For example, the oxidation gas is O$_2$ or O$_3$.

The hydrogen gas suppliers 50 and 60 serving as a third supplier supply a hydrogen gas to third areas A3_1 and A3_2 in the reaction chamber 10. The two hydrogen gas suppliers 50 and 60 are provided at positions between the source gas supplier 30 and the oxidation gas supplier 40 in the rotation direction Ast of the stage 20, respectively. The third area A3_1 is a fan-shape spatial region between the broken line L2 and the broken line L3 in the space of the reaction chamber 10 shown in FIG. 1A. The third area A3_2 is a fan-shape spatial region between the broken line L1 and the broken line L4 in the space of the reaction chamber 10 shown in FIG. 1A. In FIG. 1A, the third areas A3_1 and A3_2 are marked with oblique lines.

The two third areas A3_1 and A3_2 are both provided between the first area A1 and the second area A2. The hydrogen gas suppliers 50 and 60 supply the hydrogen gas to the third areas A3_1 and A3_2, respectively, whereby the hydrogen gas separates the first area A1 and the second area A2 from each other. That is, the areas A1 to A3_2 are not separated by physical partitions or the like but are separated by the hydrogen gas to prevent the source gas and the oxidation gas from mixing with each other. Therefore, the source gas and the hydrogen gas may be mixed to some degree near boundary portions (the broken lines L1 and L2) between the first area A1 and the third areas A3_1 and A3_2. Furthermore, the oxidation gas and the hydrogen gas may be mixed to some degree near boundary portions (the broken lines L3 and L4) between the second area A2 and the third areas A3_1 and A3_2. However, no problem occurs as long as the areas are separated in such a manner that the source gas in the first area A1 and the oxidation gas in the second area A2 are hardly mixed with each other.

In a forming process of a deposited film, the stage 20 can move the semiconductor substrate W to the first to third areas A1 to A3_2 by rotating (rotating on its own axis). For example, while rotating (rotating on its own axis) at a predetermined speed, the stage 20 moves the semiconductor substrate W to the first area A1, the third area A3_1, the second area A2, and the third area A3_2, . . . in this order. In the first area A1, the source film adheres to the semiconductor substrate W. In the second area A2, the source film is oxidized and a deposited film at an atomic layer level is formed on the semiconductor substrate W. In this way, each time the stage 20 rotates, a film forming cycle is performed and a deposited film at an atomic layer level is formed on the semiconductor substrate W. By repeating this film forming cycle, the film forming apparatus 1 can form a deposited film of a desired thickness on the semiconductor substrate W.

The gas discharging parts 35 and 45 discharge the source gas, the oxidation gas or the hydrogen gas, and the like remaining in the reaction chamber 10 in the film forming cycle. The driver 70 is, for example, a motor and rotates the stage 20 around the center C of the stage 20 as the axis. The controller 80 controls the driver 70 to control the rotational speed of the stage 20. The controller 80 can also control the temperature in the reaction chamber 10, the gas pressure in the reaction chamber 10, the flow rate of the source gas, the flow rate of the oxidation gas, the flow rate of the hydrogen gas, and the like.

In the forming process of a deposited film, the stage 20 moves the semiconductor substrate W to pass through the third area A3_1 or A3_2 when moving the semiconductor substrate W between the first area A1 and the second area A2.

The film forming apparatus 1 according to the present embodiment supplies the hydrogen (H$_2$) gas instead of a nitrogen (N$_2$) gas to the third areas A3_1 and A3_2.

If the nitrogen (N$_2$) purge is performed in the third areas A3_1 and A3_2, the partial pressure ratio of H$_2$O/H$_2$ (O$_2$/H$_2$) is increased by an oxygen gas remaining in the reaction chamber 10. This is because the ratio of the partial pressure of oxygen to the gas pressure of hydrogen is increased due to the remaining oxygen gas. The partial pressure ratio of H$_2$O/H$_2$ is the ratio of the partial pressure of water to that of hydrogen and the partial pressure ratio of O$_2$/H$_2$ is the ratio of the partial pressure of oxygen to that of hydrogen. It can be considered that the gas pressure ratio of O$_2$/H$_2$ is one-fourth of the gas pressure ratio of H$_2$O/H$_2$.

Figure 2:
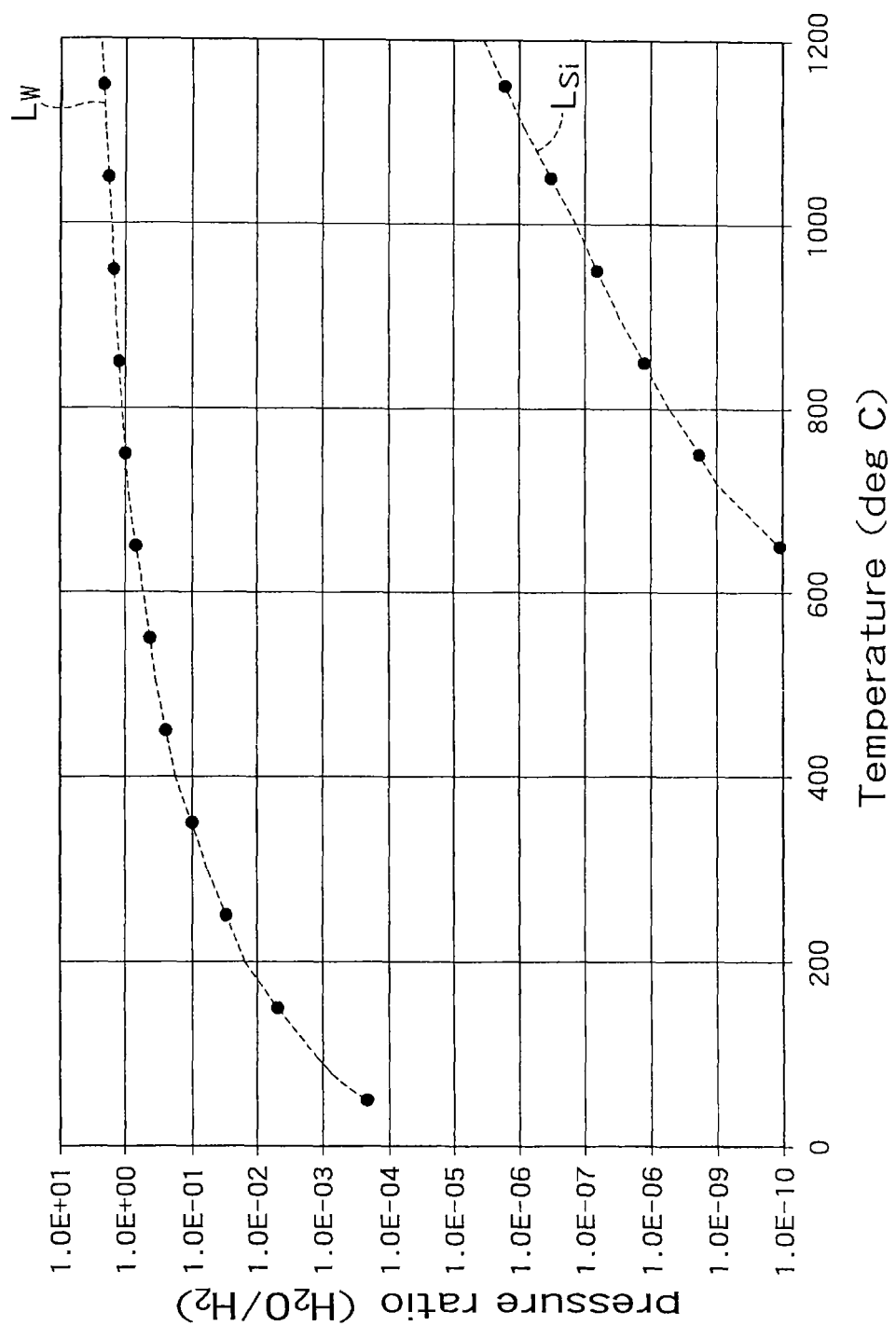
FIG. 2 is a graph showing selective oxidation conditions of certain materials as relations between the partial pressure ratio of $H_2O/H_2$ and the processing temperature.

FIG. 2 is a graph showing selective oxidation conditions of certain materials as relations between the partial pressure ratio of H$_2$O/H$_2$ and the processing temperature. The vertical axis of the graph represents the partial pressure ratio of H$_2$O/H$_2$ and the horizontal axis represents the processing temperature. A line Lw is a selective oxidation line of tungsten and a line Lsi is a selective oxidation line of silicon. The materials are oxidized in conditions upper left of the lines Lw and Lsi in the graph, respectively. On the other hand, the materials are not oxidized in conditions lower right of the lines Lw and Lsi, respectively. For example, referring to the selective oxidation line Lw of tungsten, tungsten is oxidized when the partial pressure ratio of H$_2$O/H$_2$ exceeds about 1.0 in an atmosphere at about 600° C. to about 800° C. On the other hand, tungsten is not oxidized when the partial pressure ratio of H$_2$O/H$_2$ is equal to or lower than about 1.0 in the atmosphere at about 600° C. to about 800° C. Referring to the selective oxidation line Lsi of silicon, silicon is oxidized, for example, when the partial pressure ratio of H$_2$O/H$_2$ exceeds about $8.0 \times 10^{-9}$ in an atmosphere at about 800° C. On the other hand, silicon is not oxidized when the partial pressure ratio of H$_2$O/H$_2$ is equal to or lower than about $8.0 \times 10^{-9}$ in the atmosphere at about 800° C.

When a silicon dioxide film is to be formed by LPRO (Low Pressure Radical Oxidation) at a processing temperature of about 600° C. to about 800° C. or the like without oxidizing the word lines (tungsten), the partial pressure ratio of H$_2$O/H$_2$ needs to be within a range from about $8.0 \times 10^{-9}$ to about 1.0 (the partial pressure ratio of O$_2$/H$_2$ needs to be within a range from about $2.0 \times 10^{-9}$ to about 0.25). This is because silicon can be selectively oxidized in this range without oxidizing tungsten. However, if an oxygen gas remains, the partial pressure ratio of H$_2$O/H$_2$ may exceed 1.0 during the N$^2$ purge. This is because N$_2$ does not relate to the partial pressure ratio of H$_2$O/H$_2$ and the ratio of oxygen (the ratio of H$_2$O) is increased by the remaining oxygen gas. In this case, there is a risk of oxidation of tungsten as well as silicon. If tungsten that forms the word lines is oxidized, the resistance of the word lines is increased.

In contrast thereto, the film forming apparatus 1 according to the present embodiment supplies the hydrogen ($H_2$) gas instead of the nitrogen ($N_2$) gas to the third areas A3_1 and A3_2. Accordingly, even if an oxygen gas remains, the ratio of the hydrogen ($H_2$) gas can be increased and thus it is possible to surely suppress the partial pressure ratio of $H_2O/H_2$ to about 1.0 or lower (the partial pressure ratio of $O_2/H_2$ to about 0.25 or lower). As a result, silicon can be selectively oxidized without oxidizing tungsten. Because the film forming apparatus 1 can selectively oxidize silicon at a relatively high temperature of about 600° C. to about 800° C., a high-quality silicon dioxide film can be formed without oxidizing tungsten.

As described above, the partial pressure ratio of $H_2O/H_2$ needs to be about $8.0 \times 10^{-9}$ or higher to oxidize silicon. However, it suffices that this condition is met in the second area A2 in which selective oxidation is performed and the condition of the partial pressure ratio of $H_2O/H_2$ at about $8.0 \times 10^{-9}$ or higher is not required in the third areas A3_1 and A3_2 because it is unnecessary to oxidize silicon therein. Furthermore, because the oxidation gas can be supplied to the second area A2, the partial pressure ratio of $H_2O/H_2$ can be adjusted to a value equal to or higher than about $8.0 \times 10^{-9}$ and equal to or lower than about 1.0.

Figure 3:
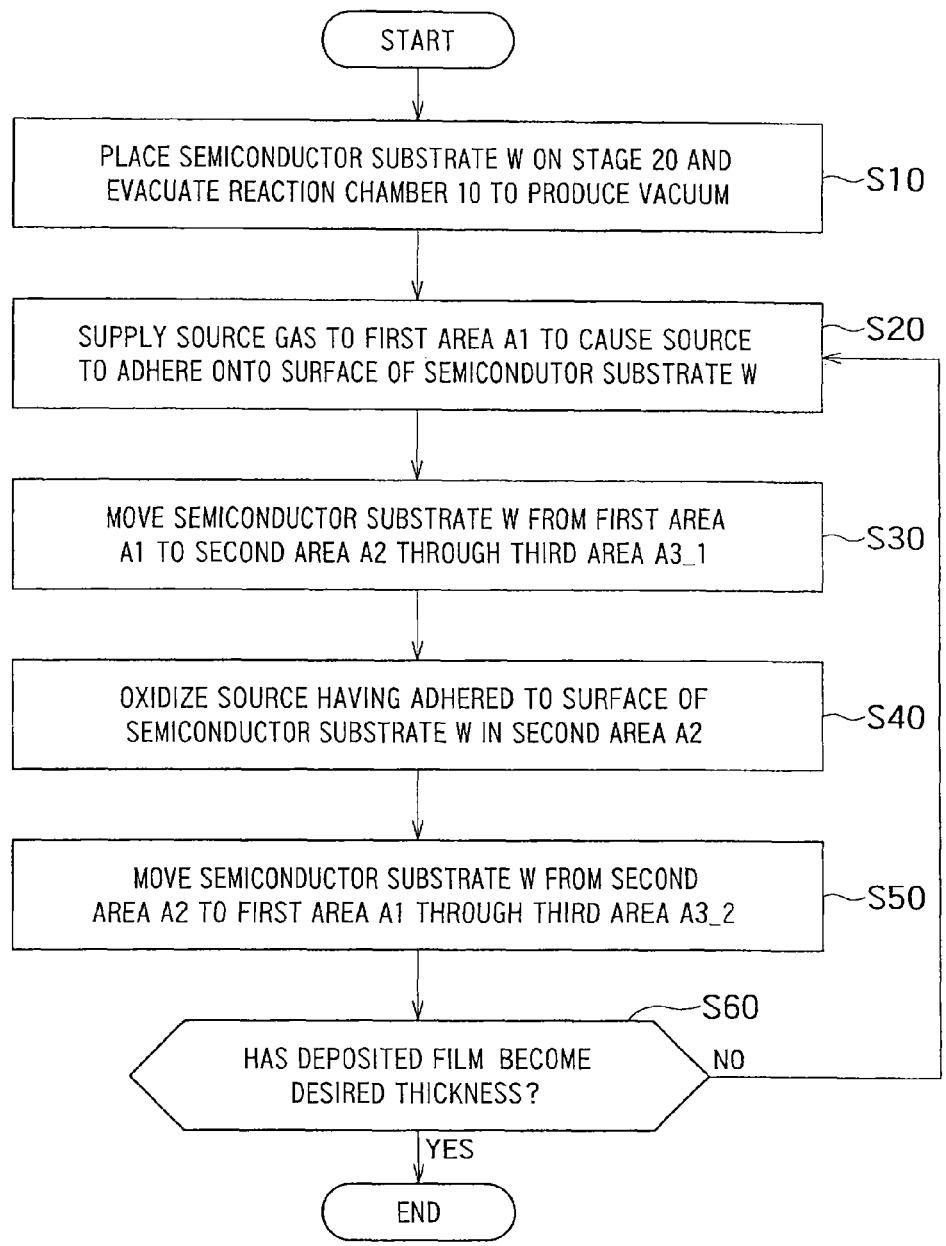
FIG. 3 is a flowchart showing a manufacturing method of a semiconductor device using the film forming apparatus 1 according to the present embodiment.

FIG. 3 is a flowchart showing a manufacturing method of a semiconductor device using the film forming apparatus 1 according to the present embodiment.

First, the semiconductor substrate W is placed on the stage 20 and the reaction chamber 10 is evacuated to produce a vacuum (Step S10). Next, the film forming apparatus 1 supplies the source gas to the first area A1 to cause the source to adhere onto the surface of the semiconductor substrate W (Step S20). Accordingly, a source film (such as $SiCl_3$) is formed on the surface of the semiconductor substrate W.

Subsequently, the film forming apparatus 1 moves the semiconductor substrate W to pass through the third area A3_1, thereby moving the semiconductor substrate W from the first area A1 to the second area A2 (Step S30). The source having adhered to the surface of the semiconductor substrate W is oxidized by the oxidation gas and a deposited film is formed in the second area A2 (Step S40). In this case, the temperature in the reaction chamber 10 is about 600° C. to about 800° C. and the partial pressure ratio ($O_2/H_2$) between oxygen and hydrogen in the reaction chamber 10 is equal to or lower than 0.25 or the partial pressure ratio ($H_2O/H_2$) between water and hydrogen is equal to or lower than 1.0. In the second area A2, the partial pressure ratio ($H_2O/H_2$) between water and hydrogen is equal to or higher than about $8.0 \times 10^{-9}$. Accordingly, a silicon dioxide film at an atomic layer level can be formed on the surface of the semiconductor substrate W without oxidizing the word lines (tungsten, for example).

Next, the film forming apparatus 1 moves the semiconductor substrate W to pass through the third area A3_2, thereby moving the semiconductor substrate W from the second area A2 to the first area A1 again (S50).

Thereafter, until the deposited film has a desired thickness, the film forming cycle at Steps S20 to S50 is repeated (NO at Step S60). When the deposited film has the desired thickness (YES at Step S60), the film forming process ends.

Figure 4:
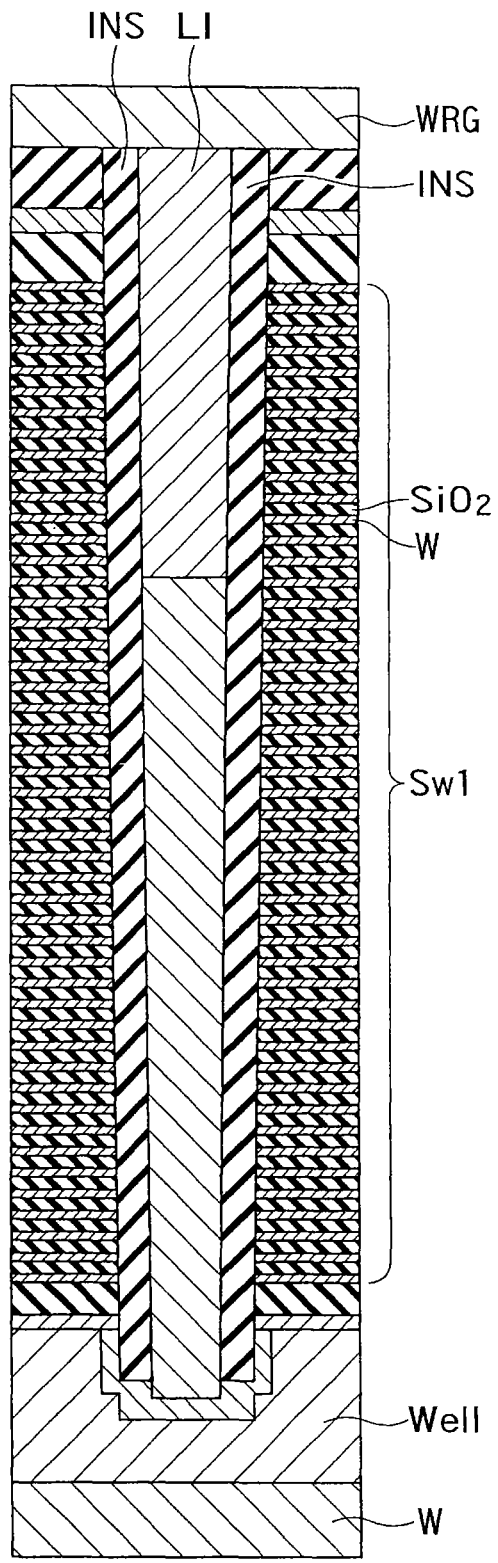
FIG. 4 is a cross-sectional view showing an example of local interconnects LI provided in a stacked layer structure Sw1 of word lines.

The manufacturing method according to the present embodiment can be used, for example, for contacts applied to a three-dimensionally stacked memory. FIG. 4 is a cross-sectional view showing an example of local interconnects (hereinafter, also simply "contacts") LI provided in a stacked layer structure Sw1 of word lines. The contacts LI electrically connect between a diffusion layer Well of the semiconductor substrate W and an upper layer wiring WRG while keeping an insulating state from the stacked layer structure Sw1 of the word lines. For this purpose, it is necessary to form the contacts LI deeply and form a silicon dioxide film INS on side surfaces of contact holes. When such a silicon dioxide film INS is formed by the film forming apparatus 1 according to the present embodiment, a high-quality silicon dioxide film INS can be formed to reach deep portions of the contact holes at substantially-uniform film thicknesses without oxidizing the word lines (tungsten, for example).

While deposition of a silicon dioxide film has been explained above, the present embodiment can be also applied to deposition of other deposited films (such as $Al_2O_3$ (alumina), $HfO_2$ (hafnia), and $Zr_2O_3$ (zirconia)). In this case, it suffices to set the processing temperature and the partial pressure ratio ($O_2/H_2$) between oxygen and hydrogen or the partial pressure ratio ($H_2O/H_2$) between water and hydrogen to ranges appropriate for a material (a source) of the deposited film.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus, comprising:
a reaction chamber in which a semiconductor substrate is capable of being accommodated when a deposited film is to be formed on a surface of the semiconductor substrate;
an oxidizable source gas inlet provided at an upper portion of the reaction chamber in a first area and supplying an oxidizable source gas to the first area in the reaction chamber;
an oxidation gas inlet provided at an upper portion of the reaction chamber in a second area and supplying an oxidation gas to the second area in the reaction chamber;
a hydrogen gas inlet provided at an upper portion of the reaction chamber in a third area, which is between the first area and the second area in the reaction chamber, and supplying a hydrogen gas to the third area to separate the first area and the second area from each other without physical partitions such that the oxidizable source gas and the oxidation gas are not mixed;
a rotating stage, which rotates around a center of the stage and on which a plurality of the semiconductor substrates are mounted, wherein rotation of the stage moves the semiconductor substrate to the first area, the third area, the second area, and the third area in this order; and
gas discharging parts respectively provided at vertical side walls of the reaction chamber in the first and second areas;
wherein:
the stage is circular;

the first to third areas are fan-shaped areas on a surface of the stage, respectively, and the first to third areas make a circle on the stage;

the second area is located on an opposite side of the center of the stage to the first area;

the stage has two third areas which are located at positions between the first area and the second area, respectively;

the oxidation gas inlet is located on an opposite side of the center of the stage to the oxidizable source gas inlet; and two hydrogen gas inlets are provided and are located at positions between the oxidizable source gas inlet and the oxidation gas inlet in a rotation direction of the stage, respectively, the stage moves the semiconductor substrate to one of the third areas after passing through the first area and to another of the third areas after passing through the second area while rotating in a forming process of the deposited film.

2. The apparatus of claim 1, wherein a temperature in the reaction chamber is about 600° C. to about 800° C. and a partial pressure ratio (partial pressure of $O_2$/partial pressure of $H_2$) between oxygen and hydrogen in the reaction chamber is equal to or lower than 0.25 or a partial pressure ratio (partial pressure of $H_2O$/partial pressure of $H_2$) between water and hydrogen in the reaction chamber is equal to or lower than 1.0 in a forming process of the deposited film.

* * * * *